United States Patent
Lin et al.

(10) Patent No.: US 8,071,194 B2
(45) Date of Patent: Dec. 6, 2011

(54) HEAT COLLECTOR

(75) Inventors: Jhy-Chain Lin, Taipei Hsien (TW); Ga-Lane Chen, Fremont, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 227 days.

(21) Appl. No.: 12/354,105

(22) Filed: Jan. 15, 2009

(65) Prior Publication Data

US 2009/0120614 A1 May 14, 2009

Related U.S. Application Data

(63) Continuation of application No. 11/175,772, filed on Jul. 6, 2005, now Pat. No. 7,493,943.

(30) Foreign Application Priority Data

Jul. 16, 2004 (CN) .......................... 2004 1 0028189

(51) Int. Cl.
*B32B 3/02* (2006.01)
*B32B 5/14* (2006.01)
(52) U.S. Cl. ................. 428/64.1; 428/310.5; 428/312.8; 428/447; 165/10; 165/185; 165/907; 165/909; 165/DIG. 42
(58) Field of Classification Search .................. 165/185, 165/10, 907, 909, DIG. 42; 428/64.1, 304.4, 428/310.5, 312.6, 312.8, 447; 361/704, 709, 361/710
See application file for complete search history.

(56) References Cited

U.S. PATENT DOCUMENTS

| | | | | |
|---|---|---|---|---|
| 4,884,331 A | * | 12/1989 | Hinshaw | 29/558 |
| 6,411,508 B1 | * | 6/2002 | Kang et al. | 361/695 |
| 6,424,531 B1 | * | 7/2002 | Bhatti et al. | 361/704 |
| 6,735,864 B2 | * | 5/2004 | Sato et al. | 29/890.03 |
| 2001/0051673 A1 | * | 12/2001 | Suzuki et al. | 523/137 |

FOREIGN PATENT DOCUMENTS

FR 2766967 A1 * 2/1999
JP 2000294888 A * 10/2000

OTHER PUBLICATIONS

Machine translation of description of JP 2000-294888 created on Mar. 14, 2011.*
Machine translation of description of FR 2766967 created on Mar. 14, 2011.*
Updated machine translation of FR 2766967 acquired on Aug. 3, 2011.*

* cited by examiner

*Primary Examiner* — Gerard Higgins
(74) *Attorney, Agent, or Firm* — Altis Law Group, Inc.

(57) ABSTRACT

A heat collector includes a heat absorption surface, an opposite heat focus surface and one or more surrounding sides. A matrix of the heat collector is a thermally conductive material. There is a plurality of adiabatic pores mixed within the matrix. A relative concentration distribution of the adiabatic pores increases from the heat absorption surface to the heat focus surface, and decreases from the surrounding sides to a center of the heat collector. The shape of the heat collector can be rectangular, cylindrical, prismatic, plate-shaped, square, or polyhedral. The heat collector can draw heat generated from electrical components, and collect the generated heat for reuse in order to enhance energy efficiency.

18 Claims, 5 Drawing Sheets

HEAT COLLECTOR

CROSS-REFERENCE TO RELATED APPLICATION

This patent application is continuation of application Ser. No. 11/175,772, filed on Jul. 6, 2005, now U.S. Pat. No. 7,493,943 entitled "HEAT COLLECTOR", assigned to the same assignee, disclosure of which is incorporated herein by reference in its entirety.

TECHNICAL FIELD

The present disclosure relates to a heat collector, and more specifically, to a heat collector used to draw and reuse heat from electrical components.

BACKGROUND

With advances in electronics technology, modern computer components and other electrical components can operate at high speeds and frequencies, and these electrical components typically generate large amounts of heat. Additionally, such electrical components continue to decrease in size with each succeeding generation released, and it is becoming more and more difficult to effectively dissipate heat from the components using conventional means. Electrical components may frequently operate at increased temperatures, which can lead to degradation or even failure of the components or associated systems.

There are numerous kinds of heat-dissipating devices used to cool electrical components. For example, a typical heat sink device is disclosed in U.S. Pat. No. 4,884,331 issued on Dec. 5, 1989. The heat sink includes a pedestal with dissipating fins thereon. The pedestal is attached to a surface of an electrical component, and transfers heat generated from the electrical component to ambient air.

Another kind of heat-dissipating device is a heat pipe, such as that disclosed in China patent 99117239 issued on Feb. 18, 2004. The heat pipe has high heat conductive efficiency, and dissipates heat fast.

A cooling fan is another kind of heat-dissipating device. The fan is used to speed up circulation of air around electrical components, and thereby increase heat convection. A typical example is found in U.S. Pat. No. 6,745,824 issued on Jun. 8, 2004.

Other related kinds of heat-dissipating devices include heat conductive materials, such as carbon nanotubes. The heat conductive materials have high thermal conductivity, and are typically employed between an electrical component and a heat sink. The heat conductive materials are used to reduce the thermal resistance between the electrical component and the heat sink. A typical example is found in China patent application 02152003, published on Jun. 2, 2004.

All the devices mentioned above only focus on how to dissipate heat from electrical components, without properly considering how the generated heat might be reused in order to save energy and preserve the environment. What is needed, therefore, is a device that can transfer unwanted heat from an electrical component, and can collect that heat for reuse by way of, for example, transforming it to electricity or light.

BRIEF DESCRIPTION OF THE DRAWINGS

Many aspects of the present heat collector can be better understood with reference to the following drawings. The components in the drawings are not necessarily drawn to scale, the emphasis instead being placed upon clearly illustrating the principles of the present heat collector. Moreover, in the drawings, like reference numerals designate corresponding parts throughout the several views.

DETAILED DESCRIPTION OF EMBODIMENTS

Hereinafter, embodiments of the present disclosure will be described. However, the scope of the present disclosure is not to be taken as being limited to the described embodiments.

Figure 1:
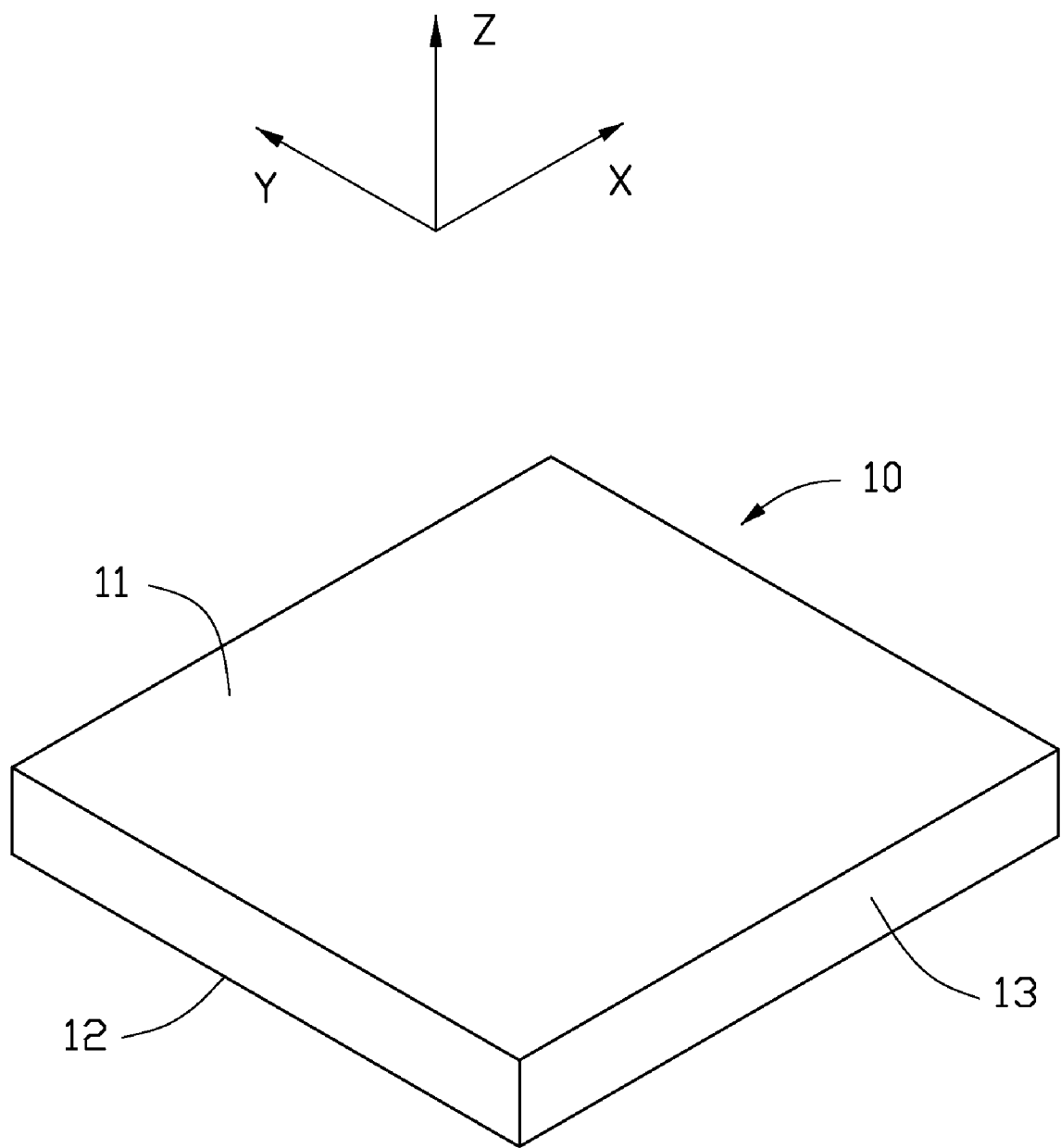
FIG. 1 is an isometric view of a rectangular heat collector in accordance with a first embodiment of the present disclosure, the heat collector comprising adiabatic dope.

Referring to FIG. 1, a generally rectangular heat collector 10 is shown. The heat collector 10 has a heat focus surface 11, an opposite heat absorption surface 12, and surrounding sides 13. A matrix of the heat collector 10 is made from a thermally conductive material having a thermal conductivity greater than 0.6 W/m.K. There is adiabatic means like adiabatic dope (not shown) mixed within the matrix of the heat collector 10, and a thermal conductivity of the adiabatic dope is less than 0.1 W/m.K. X, Y and Z reference axes are defined for the heat collector 10, as shown in FIG. 1.

Figure 2:
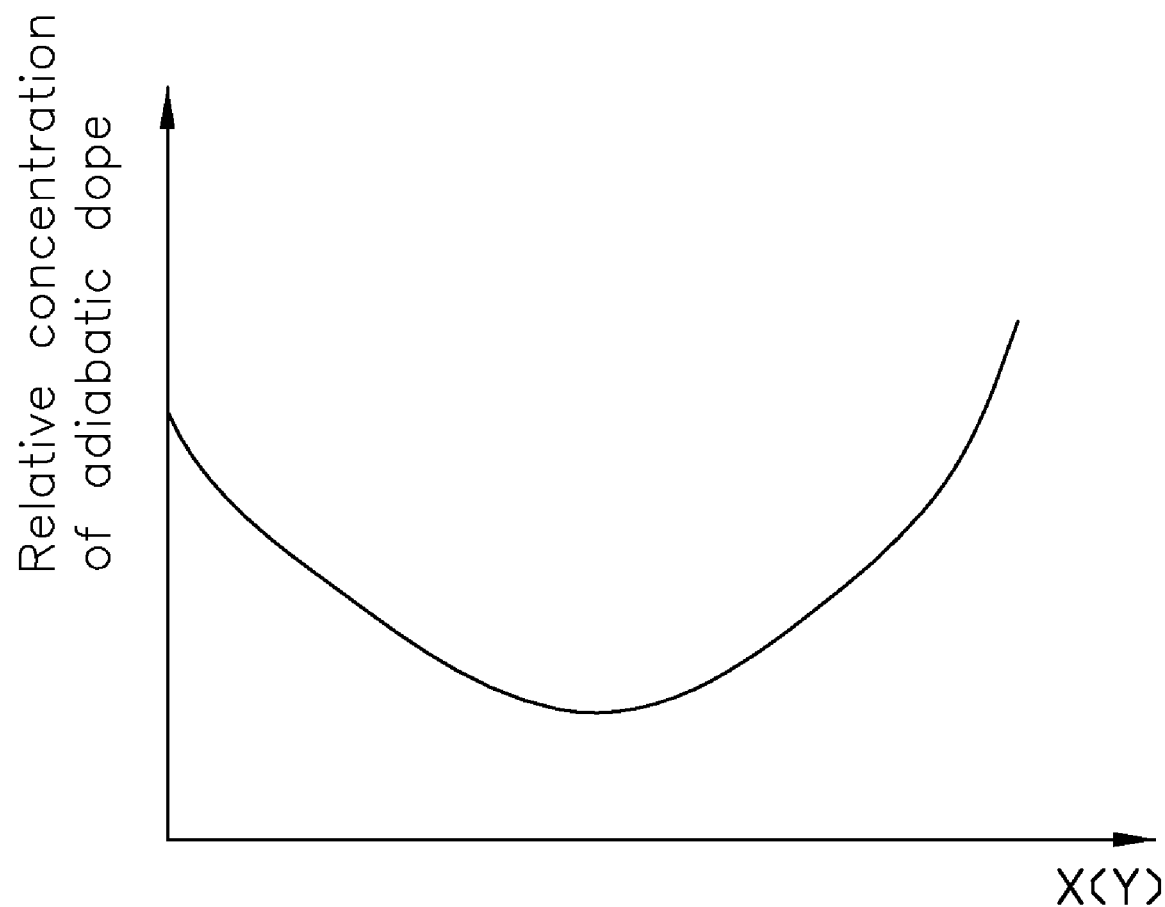
FIG. 2 is a relative concentration distribution profile of adiabatic dope along an X-axis and a Y-axis of the heat collector in accordance with the first embodiment.

FIG. 2 shows a relative concentration distribution of the adiabatic dope along the X-axis and the Y-axis of the heat collector 10. The relative concentration of the adiabatic dope is greatest at the surrounding sides 13, and progressively decreases toward the X-Y center of the heat collector 10. In this embodiment, concentration at the X-Y center of the heat collector 10 is 0%, and at the surrounding sides is as near as practicable to 100%.

Figure 3:
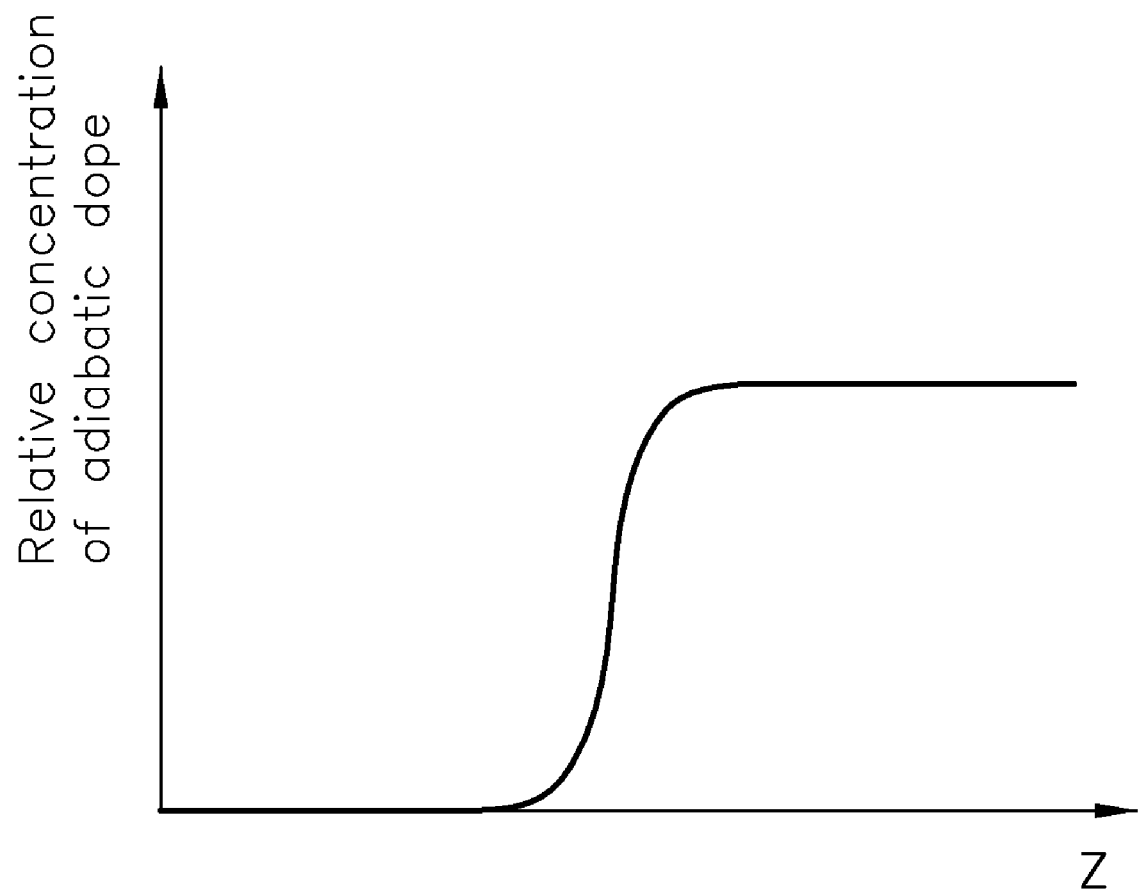
FIG. 3 is a relative concentration distribution profile of adiabatic dope along a Z-axis of the heat collector in accordance with the first embodiment.

FIG. 3 shows a relative concentration distribution of the adiabatic dope along the Z-axis of the heat collector 10. The relative concentration of the adiabatic dope is 0% at the heat absorption surface 12, and progressively increases toward the heat focus surface 11. In this embodiment the relative concentration at the central axis of the heat collector is 0%.

Figure 4:
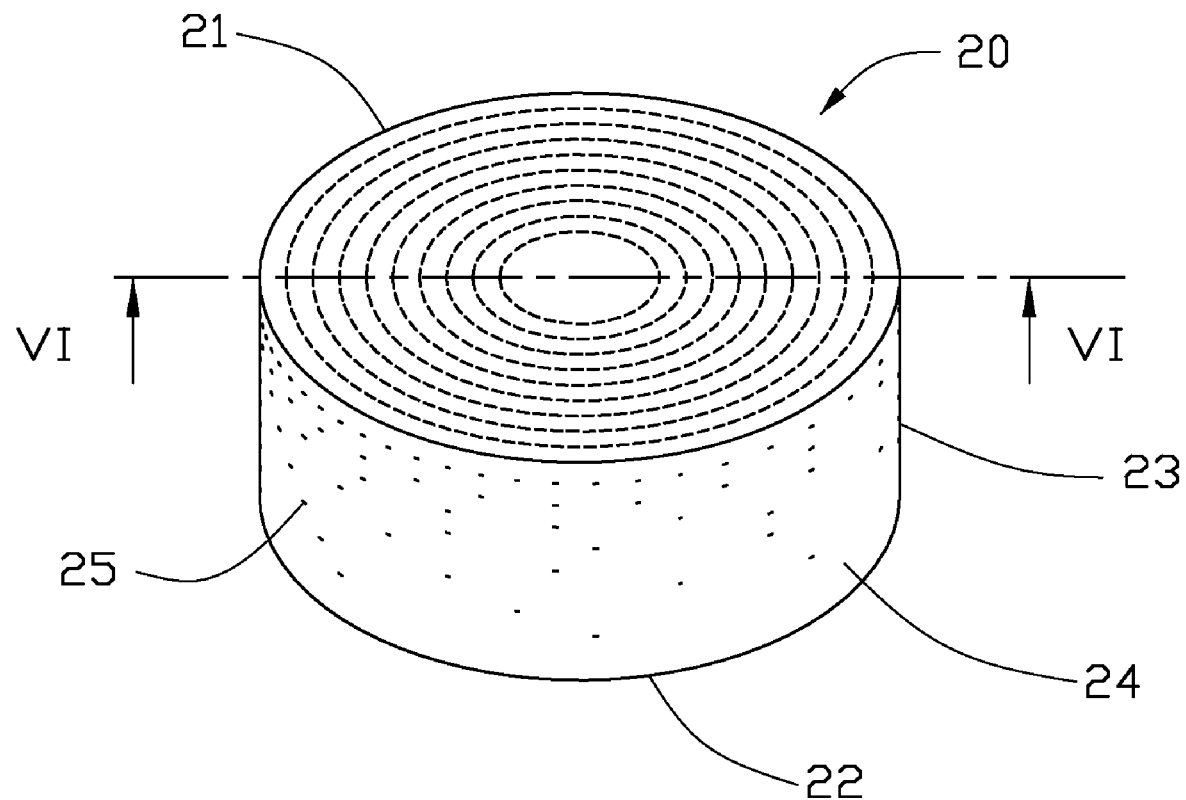
FIG. 4 is an isometric view of a cylindrical heat collector in accordance with a second embodiment of the present disclosure, the heat collector comprising adiabatic dope.

Referring to FIG. 4, a generally cylindrical heat collector 20 of a second embodiment is shown. The heat collector 20 has a heat focus surface 21, an opposite heat absorption surface 22, and a surrounding side 23. A matrix 24 of the heat collector 20 is made from a thermally conductive material having a thermal conductivity greater than 0.6 W/m.K. There is adiabatic dope 25 mixed within the matrix 24 of the heat collector 20, and a thermal conductivity of the adiabatic dope 25 is less than 0.1 W/m.K.

Figure 5:
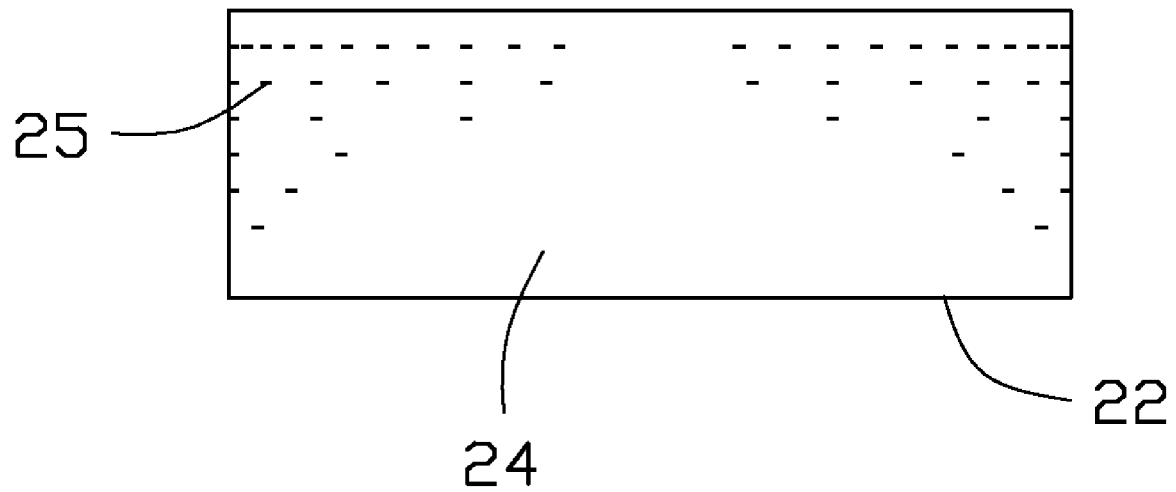
FIG. 5 is a schematic, side cross-sectional view of the heat collector of FIG. 4 taken along line V-V thereof, showing a relative concentration distribution of adiabatic dope therein.

A relative concentration distribution of the adiabatic dope 25 is shown in FIG. 5, which is a schematic cross-sectional view of the heat collector 20. In one aspect, the relative concentration distribution of the adiabatic dope 25 is radially symmetric about a central axis (not shown) of the heat collector 20. The relative concentration of the adiabatic dope 25 is the greatest at the surrounding side 23, and progressively decreases toward the central axis of the heat collector 20. In this embodiment, concentration at the central axis of the heat collector 20 is 0%. In another aspect, the relative concentration of the adiabatic dope 25 is 0% at the heat absorption surface 22, and progressively increases toward the heat focus surface 21. A relative concentration at a periphery of the heat focus surface 21 is as near as practicable to 100%.

The matrixes of the heat collectors 10, 20 are made from flexible materials in these embodiments, such as silver paste, silicon rubber, or non-silicon rubber. The adiabatic dope may be a polymer, a ceramic, silicon oxide and/or asbestos. Further or alternatively, the adiabatic means may take the form of a plurality of pores in the heat collectors 10, 20.

Besides being generally rectangular or cylindrical, the shape of the heat collectors 10, 20 may be, for example, prismatic, plate-shaped, generally square, or polyhedral. Each of the heat absorption surfaces 12, 22 is suitable for attachment to a heat generating surface of an electronic component (not shown). The heat collector 10, 20 transfer heat generated from the surface of the electronic component to the heat focus surfaces 11, 21. Because the relative concentration distribution of the adiabatic dope guides the heat flow from non-convergence to convergence, it is easy to collect and reuse the generated heat.

Although only the above embodiments have been described in detail, it will be apparent to those skilled in the art that various modifications are possible without departing from the inventive concepts herein. Therefore the disclosure is not limited to the above-described embodiments, but rather has a scope defined by the appended claims and allowable equivalents thereof.

What is claimed is:

1. A heat collector comprising two opposite surfaces and one or more surrounding sides; wherein a matrix of the heat collector is made from a thermally conductive material; and a plurality of adiabatic pores are within the matrix; wherein the relative concentration distribution of the adiabatic pores progressively increases from one of the opposite surfaces to the other opposite surface, and progressively decreases from the surrounding sides to the center of the heat collector, the amount of adiabatic pores progressively increases from the one of the opposite surfaces to the other opposite surface, the opposite surface having the smaller relative concentration of the adiabatic pores is a heat absorption surface, and the relative concentration of the adiabatic pores at the heat absorption surface is 0%.

2. The heat collector according to claim 1, wherein the heat collector is rectangular, cylindrical, prismatic, plate-shaped, square, or polyhedral.

3. The heat collector according to claim 1, wherein the thermal conductivity of the thermally conductive material is greater than 0.6 W/m.K.

4. The heat collector according to claim 1, wherein the thermally conductive material is flexible.

5. The heat collector according to claim 4, wherein the thermally conductive material is silver paste, silicon rubber, or non-silicon rubber.

6. The heat collector according to claim 1, wherein the other opposite surface that has the larger relative concentration of the adiabatic pores is a heat focus surface.

7. The heat collector according to claim 6, wherein the relative concentration of the adiabatic pores at the center of the heat focus surface is 0% and increases from the center to the surrounding sides.

8. The heat collector according to claim 1, wherein the concentration of the adiabatic pores along the central axis of the heat collector is 0%.

9. The heat collector according to claim 6, wherein the heat collector is substantially rectangular.

10. A substantially cylindrical heat collector comprising two opposite surfaces and one surrounding side; wherein a matrix of the heat collector is made from a thermally conductive material; a plurality of adiabatic pores are within the matrix; wherein the relative concentration distribution of the adiabatic pores is radially symmetric about the central axis of the heat collector, progressively increases from one of the opposite surfaces to the other opposite surface, and progressively decreases from the surrounding sides to the center of the heat collector, wherein the opposite surface that has the larger relative concentration of the adiabatic pores is a heat focus surface, the relative concentration of the adiabatic pores at the center of the heat focus surface is 0%, and the relative concentration of the adiabatic pores progressively increases from the center to the surrounding side.

11. The heat collector according to claim 10, wherein the opposite surface that has the smaller relative concentration of the adiabatic pores is a heat absorption surface.

12. The heat collector according to claim 11, wherein the relative concentration of the adiabatic pores at the heat absorption surface is 0%.

13. The heat collector according to claim 10, wherein the relative concentration of the adiabatic pores along the central axis of the heat collector is 0%.

14. A heat collector comprising two opposite surfaces and one or more surrounding sides; wherein a matrix of the heat collector is made from a thermally conductive material; and a plurality of adiabatic pores are within the matrix; wherein the relative concentration distribution of the adiabatic pores progressively increases from one of the opposite surfaces to the other opposite surface, and progressively decreases from the surrounding sides to the center of the heat collector, the amount of adiabatic pores progressively increases from the one of the opposite surfaces to the other opposite surface, and the concentration of the adiabatic pores along the central axis of the heat collector is 0%.

15. The heat collector according to claim 14, wherein the heat collector is rectangular, cylindrical, prismatic, plate-shaped, square, or polyhedral.

16. The heat collector according to claim 14, wherein the thermal conductivity of the thermally conductive material is greater than 0.6 W/m.K.

17. The heat collector according to claim 14, wherein the thermally conductive material is flexible.

18. The heat collector according to claim 14, wherein the thermally conductive material is silver paste, silicon rubber, or non-silicon rubber.

* * * * *